United States Patent [19]

Heinen

[11] Patent Number: 4,818,722

[45] Date of Patent: Apr. 4, 1989

[54] METHOD FOR GENERATING A STRIP WAVEGUIDE

[75] Inventor: Jochen Heinen, Haar, Fed. Rep. of Germany

[73] Assignee: Siemens Aktiengesellschaft, Berlin and Munich, Fed. Rep. of Germany

[21] Appl. No.: 54,237

[22] Filed: May 26, 1987

[30] Foreign Application Priority Data

Sep. 29, 1986 [DE] Fed. Rep. of Germany ....... 3633079

[51] Int. Cl.$^4$ .......................................... H01L 21/208
[52] U.S. Cl. .................................... 437/129; 437/133; 437/119; 437/120; 437/126; 437/124; 437/122; 148/DIG. 50; 148/DIG. 29; 148/DIG. 66; 148/DIG. 65; 148/DIG. 72; 148/DIG. 108; 156/637; 156/624; 357/16; 357/17; 372/45; 372/46
[58] Field of Search ............... 148/DIG. 50, DIG. 29, 148/DIG. 66, DIG. 65, DIG. 72, DIG. 95, DIG. 101, DIG. 108, DIG. 119; 156/624, 637; 357/16, 17, 56; 372/45, 46; 437/129, 133, 119, 129, 120, 126, 122, 124

[56] References Cited

U.S. PATENT DOCUMENTS

| | | | |
|---|---|---|---|
| 3,960,618 | 6/1976 | Kawamura et al. | 437/122 |
| 4,110,133 | 8/1978 | Garrett et al. | 437/120 |
| 4,137,107 | 1/1979 | Nijman et al. | 437/129 |
| 4,227,962 | 10/1980 | Antypas | 437/949 |
| 4,366,569 | 12/1982 | Hirao et al. | 437/130 |
| 4,373,989 | 2/1983 | Mattauch et al. | 437/120 |
| 4,426,702 | 1/1984 | Yamashita et al. | 437/130 |
| 4,464,211 | 8/1984 | Logan et al. | 437/122 |
| 4,496,403 | 1/1985 | Turley | 437/130 |
| 4,500,367 | 2/1985 | Keramidas et al. | 437/130 |
| 4,566,171 | 1/1986 | Nelson et al. | 437/129 |
| 4,662,983 | 5/1987 | Chin | 148/DIG. 17 |

OTHER PUBLICATIONS

Kano et al., "Operation Characteristics of Buried-Strip GaInAsP/InP DH Lasers Made by Melt-Back Method" J. Appl. Phys., vol. 50, Dec. 1979.
Sarhidi et al., "New 1-6 μm Wavelength GaInAsP/InP Buried Heterostructure Lasers", Electronics Letters, May 8, 1980.

Primary Examiner—Brian E. Hearn
Assistant Examiner—Beverly A. Pawlikowski
Attorney, Agent, or Firm—Hill, Van Santen, Steadman & Simpson

[57] ABSTRACT

A method for generating a strip laser in a buried heterostructure composed of layers, wherein a raised strip is etched out of the layer structure and the strip is laterally etched with an erosion melt. The lateral edges of the laser active layer are protected by leaving them covered with a portion of the layer dissolved out by the erosion melt. The deposits thus remaining are used to initiate the generation of an epitaxial layer which extends laterally from the laser-active layer.

8 Claims, 1 Drawing Sheet

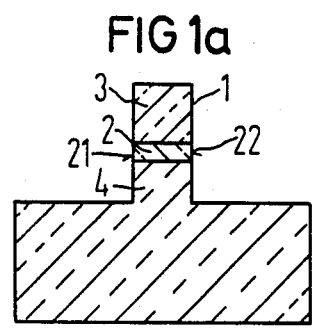
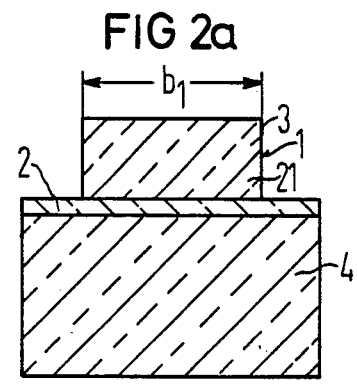
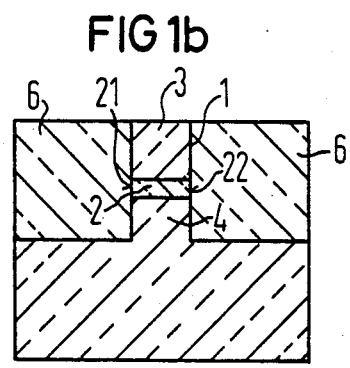
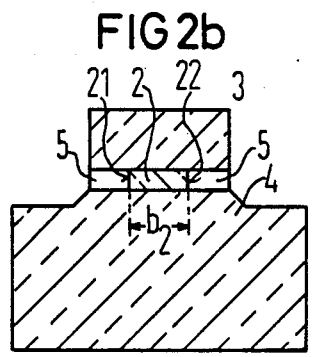
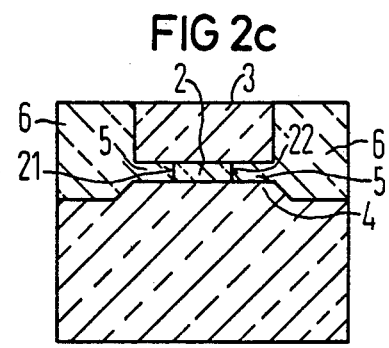

METHOD FOR GENERATING A STRIP WAVEGUIDE

BACKGROUND OF THE INVENTION

1. Field of the Invention

The present invention is directed to a method of generating a strip waveguide using a selective etching process whereby the laser active strip is protected from exposure.

2. Description of the Prior Art

A method of the type with which the present invention is concerned for manufacturing a semiconductor laser in the form of a strip laser utilizes a laser-active zone which is buried. The method is usually carried out such that an elevated strip having a width of the strip laser is etched into an epitaxial layer comprising a double hetero-layer structure. In a second epitaxial process, the lateral marginal edges of the strip which often have multiple layers for better current blocking are closed off with indium-phosphorus. For better wetting in the second epitaxial process and for cleaning the lateral marginal surfaces of the strip, a remelt or a dissolution method is known wherein the lateral marginal surfaces are etched back by erosion melting, using less than saturated melts. The dissolution or remelting, however, occurs very briefly, for example, for 2 seconds with an indium-phosphorus melt or with an indium-arsenic melt in order to prevent excessive etching of the laser-active layer of the strip laser. The lateral marginal edges of the strip laser remain essentially planar. After the brief remelting, the erosion melt is discharged and a growth melt for growing a epitaxial layer is subsequently applied to cover the lateral edges of the strip. Between the discharge of the erosion melt and the employment of the growth melt, the lateral surfaces are exposed an subjected to chemicals and/or contaminating atmospheres, for example, the atmosphere of the process reactor. As a result, the quality of the resulting lateral marginal surfaces between the strip and the subsequently grown epitaxial layer is reduced. This reduced quality causes imperfect lateral hetero-junctions which give rise to aging mechanisms characteristic of semiconductor lasers which employ a buried hetero-layer structure with the laser-active zone in a buried location.

SUMMARY OF THE INVENTION

The present invention provides a method of the type described wherein the lateral marginal surfaces are never exposed to a harmful atmosphere or to chemical influences.

In accordance with the present invention, there is first provided an epitaxial hetero-layer structure composed of a laser-active layer located between two semiconductor layers. The width of the laser-active layer is greater than the width of the final laser-active layer desired. The hetero-layer structure is etched away with an erosion melt, the melt functioning to etch away the laser-active layer laterally more than it etches the two semiconductor layers, thereby leaving erosion melt deposits at the lateral marginal edges of the laser-active layer. These deposits serve as areas for growing an epitaxial layer laterally outwardly from the erosion melt deposits.

Boundary surfaces of high integrity can be produced between the strip and the subsequently grown epitaxial layer, thus, lateral hetero-junctions of high perfection can be obtained with the method of the present invention.

In one form of the invention, the erosion melt is removed except for the deposits in the laser-active layer and a growth melt is subsequently applied. The epitaxial layer which adjoins the lateral marginal surfaces of the laser-active layer is then generated from the growth melt together with the remaining deposits.

In a particularly preferred method, the applied erosion melt is left on the strip and is simultaneously used as a growth melt for generating the epitaxial layer adjoining the lateral marginal surfaces of the laser-active layer.

In another form of the present invention, the raised strip is etched out of the hetero-layer structure only up to the level of the laser-active layer.

The method of the present invention is suited for the manufacture of quaternary lasers comprising double hetero-structures wherein the laser-active layer is composed of indium-gallium-arsenic-phosphorus and the two adjacent layers are composed of indium-phosphorus. The erosion melt in this case can be a melt of phosphorus in indium which is less than saturated (0.5-0.95×$C_s$). During the dissolution or etching process, the temperature is either lowered or kept constant in this embodiment of the invention (typical 580°-630° C.; −dT/dt typical 0.1°-2° C./min).

An approximately saturated melt of phosphorus and indium can also be used as the erosion melt, in which case, the temperature is increased during the etching process (typical +0.5°-5° C.).

In the form of the invention wherein the remelt process is carried out up to saturation following temperature elevation, preferably in the form of a temperature jump, the remelt process changes into a growth process as a result of a succeeding reduction in temperature.

The method of the invention thus provides for generating indium-gallium-arsenic-phosphorus to indium-phosphorus boundary surfaces wherein the surfaces are certain not to be exposed to outside influences and can be produced with high precision.

BRIEF DESCRIPTION OF THE DRAWINGS

The invention will be set forth in greater detail by comparison to a known method shown in the figures of the drawings. In these figures:

FIG. 1a is a cross-sectional view through an epitaxial wafer comprising a double hetero-structure from which a raised strip corresponding to the width of a strip laser is etched;

FIG. 1b illustrates the lateral marginal surfaces of the raised strip which are closed off with an epitaxial layer;

FIG. 2a is a cross-sectional view through an epitaxial wafer comprising a double hetero-structure from which a raised strip is etched up to the laser-active layer, the width of the strip being greater than the width of the strip laser to be produced;

FIG. 2b illustrates the epitaxial wafer of FIG. 2a after a remelt process; and

FIG. 2c shows the epitaxial wafer after the lateral marginal surfaces have been closed off by an epitaxial layer.

DESCRIPTION OF THE PREFERRED EMBODIMENTS

The showings in FIGS. 1a and 1b indicate the conditions resulting after a remelt process for better wetting and for cleaning the lateral marginal surfaces of a strip 1. These lateral marginal surfaces are illustrated as surfaces 21 and 22 of an InGaAsP layer forming a laser-active layer 2 in a double hetero-structure. This type of structure can be produced by using less than saturated melts before growth of the epitaxial layer 6 of InP. The remelt process is, however, very short being approximately 2 seconds long and occuring with an InP melt or with a InAs melt in order to prevent too great an etching of the layer 2. The lateral faces of the strip 1 are therefore essentially planar. Between the exit of the erosion melt and the admission of the following growth melt, the lateral limiting surfaces of the strip 1 are exposed and are subjected to the atmosphere of the process reactor.

In accordance with the present invention, this exposure is eliminated. For example, a raised strip is first etched into the double hetero-layer structure up to the defined layer 2 as shown in FIG. 2a. The width $b_1$ of the strip 1 is made greater than the width b2 to be formed in the finished laser-active strip. For generating the lateral marginal surfaces 21 and 22 of the laser-active layer 2, an erosion melt is used, the time of etching or dissolution being such that an edge region 5 of the layer 2 containing dissolved material is present between undissolved portions of the solid layers 3 and 4 of the double hetero-layer structure which adjoin the layer 2 from above and below the same.

By controlling the degree of saturation or the amount of temperature increase, a defined predetermined width of the edge regions 5 at both sides of the layer 2 can be achieved, the material of layer 2 being dissolved therein. When discharging the melts after the conclusion of the remelting, some melt will remain in the edge regions 5 so that the lateral marginal surfaces 21 and 22 of the undissolved layer 2 of laser-active material adjacent to the edge regions 5 are not exposed. With a subsequent, supersaturated melt of phosphorus in indium, a epitaxial layer 6 adjacent to the lateral marginal surfaces 21 and 22 of the layer 2 can be generated as shown in FIG. 2c.

It is more advantageous to eliminate the discharge of the applied erosion melt, so that it is preferable to leave the melt and to employ it, after it becomes saturated in the remelt process as a growth melt for generating the epitaxial layer 6 adjacent to the lateral marginal surfaces 21 and 22 of layer 2.

The following possibilities are suitable for the remelt process, particularly for generating the lateral marginal surfaces 21 and 22 of the layer 2 in the embodiment of the invention wherein the raised strip 1 is etched out only up to the defined layer as shown in FIG. 2b.

1. Using a less than saturated In,P melt as an erosion melt at decreasing temperatures.
2. Using a less than saturated In,P melt as an erosion melt at constant temperature.
3. Using an approximately saturated In,P-melt as an erosion melt with subsequent temperature increase.

Option (3) is particularly suited for a method wherein the discharge of the erosion melt is omitted and wherein the melting process is carried out up to saturation following a temperature rise and is changed into a growth process as a result of the subsequent reduction in temperature.

The method disclosed herein is suitable not only for the manufacture of strip lasers but also is generally suitable for the manufacture of strip waveguides comprising hetero-layer structures, wherein the wave-guiding region must include high quality lateral limiting surfaces.

It should be evident that various modifications can be made to the described embodiments without departing from the scope of the present invention.

I claim as my invention:

1. A method for generating a strip waveguide which comprises:
   providing an epitaxial hetero-layer structure composed of a laser-active layer located between two semiconductor layers, the width of said laser-active layer being greater than the width of the final laser-active layer,
   forming a raised strip (1) from the epitaxial hetero-layer structure, said strip being laterally etched with an erosion melt and the lateral surface (21, 22) of the laser-active layer (2) of the htero structure functioning as a waveguide region of the strip (1) is etched away laterally more than the two semiconductor layers and is left covered by one of the erosion melt or a part (5) of said layer dissolved by said melt, and
   growing an epitaxial layer laterally outwardly from said erosion melt deposits.

2. A method according to claim 1 which includes the steps of removing said erosion melt after said etching except for said erosion melt deposits, and
   applying a growth melt to said deposits to gene-rate said epitaxial layer.

3. A method according to claim 1 wherein said erosion melt itself is used to generate said epitaxial layer from said deposits.

4. A method according to claim 1 wherein said laser-active layer is composed of indium-gallium-arsenic-phosphorus and said semiconductor layers are composed of indium-phosphorus.

5. A method according to claim 4 wherein said erosion melt is a less than saturated melt of phosphorus in indium.

6. A method according to claim 5 wherein the processing temperature is lowered during the etching process.

7. A method according to claim 4 wherein said erosion melt is a substantially saturated melt of phosphorus in indium.

8. A method according to claim 7 wherein said temperature is raised during the etching process.

* * * * *